United States Patent
Bolom et al.

(10) Patent No.: US 7,446,036 B1
(45) Date of Patent: Nov. 4, 2008

(54) GAP FREE ANCHORED CONDUCTOR AND DIELECTRIC STRUCTURE AND METHOD FOR FABRICATION THEREOF

(75) Inventors: Tibor Bolom, Fishkill, NY (US); Stephan Grunow, Wappingers Falls, NY (US); David Rath, Stormville, NY (US); Andrew Herbert Simon, Fishkill, NY (US)

(73) Assignees: International Business Machines Corporation, Armonk, NY (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/958,691

(22) Filed: Dec. 18, 2007

(51) Int. Cl.
*H01L 21/4763* (2006.01)
*H01L 21/461* (2006.01)

(52) U.S. Cl. .................. 438/640; 438/637; 438/713; 438/720; 257/E21.585

(58) Field of Classification Search .......... 438/622, 438/637, 640, 710, 713, 720
See application file for complete search history.

(56) References Cited

U.S. PATENT DOCUMENTS

| | | | |
|---|---|---|---|
| 4,707,457 A | 11/1987 | Erb | |
| 4,725,562 A | 2/1988 | El-Kareh et al. | |
| 5,482,883 A | 1/1996 | Rajeevakumar | |
| 5,629,237 A * | 5/1997 | Wang et al. | 438/701 |
| 6,008,104 A | 12/1999 | Schrems | |
| 6,121,110 A | 9/2000 | Hong et al. | |
| 6,180,466 B1 | 1/2001 | Ibok | |
| 6,236,079 B1 | 5/2001 | Nitayama et al. | |
| 6,274,483 B1 * | 8/2001 | Chang et al. | 438/640 |
| 6,355,557 B2 * | 3/2002 | Stinnett et al. | 438/640 |
| 6,528,386 B1 | 3/2003 | Summerfelt et al. | |
| 6,541,346 B2 | 4/2003 | Malik et al. | |
| 6,608,341 B2 | 8/2003 | Schrems | |
| 6,696,348 B1 * | 2/2004 | Xiang | 438/424 |
| 6,720,606 B1 | 4/2004 | Nitayama | |
| 6,828,191 B1 | 12/2004 | Wurster et al. | |
| 6,869,884 B2 * | 3/2005 | Chan et al. | 438/705 |
| 6,919,640 B2 * | 7/2005 | Jeon et al. | 257/775 |

(Continued)

FOREIGN PATENT DOCUMENTS

WO   WO 2004/102634   11/2004

OTHER PUBLICATIONS

Kairong Chu, et al., Study of Normal-gate CNT-FED Using HOP Glass, Vacuum Nanoelectronics Conference, 2006 and the 2006 50th International Field Symposium, IVNC/IFES 2006, Technical Digest, 19th International; published Jul. 2006; pp. 437-438. Abstract Only.

(Continued)

*Primary Examiner*—Alexander G Ghyka
(74) *Attorney, Agent, or Firm*—Scully, Scott, Murphy & Presser, P.C.; Todd M. C. Li, Esq.

(57) ABSTRACT

A microelectronic structure and a method for fabricating the microelectronic structure use a dielectric layer that is located and formed upon a first conductor layer. An aperture is located through the dielectric layer. The aperture penetrates vertically into the first conductor layer and extends laterally within the first conductor layer beneath the dielectric layer while not reaching the dielectric layer, to form an extended and winged aperture. A contiguous via and interconnect may be formed anchored into the extended and winged aperture while using a plating method, absent voids.

1 Claim, 1 Drawing Sheet

U.S. PATENT DOCUMENTS

| | | | |
|---|---|---|---|
| 7,081,397 | B2 | 7/2006 | Baiocco et al. |
| 7,229,894 | B2 | 6/2007 | Koh |
| 2002/0072219 | A1 | 6/2002 | Avanzino et al. |
| 2003/0100176 | A1* | 5/2003 | Kim et al. ............ 438/624 |
| 2004/0238889 | A1 | 12/2004 | Gonzalez et al. |
| 2005/0139952 | A1 | 6/2005 | Koh et al. |
| 2005/0245024 | A1 | 11/2005 | von Schwerin |
| 2007/0087501 | A1 | 4/2007 | Koshimizu et al. |

OTHER PUBLICATIONS

T. Cwik, et al., The Cascade Connection of Planar Periodic Surfaces and Lossy Dielectric Layers to Form an Arbitrary Periodic Screen, The Norwegian Institute of Technology, Dec. 1987, vol. 35, Issue 12 pp. 1397-1405. Abstract Only.

V. Galdi, et al. Two-dimensional Pulsed Propagation from Extended Planar Dielectric Layer Via Quasi-Ray Gaussian Beams, Dept. of Electric Comput. & Syst. Eng. Boston University, MA Publication Date: Jul. 2003, vol. 51, Issue 7, pp. 1549-1558. Abstract Only.

M.A. Guillorn, et al., Self-Aligned Gated Field Emission Devices Using Single Carbon Nanofiber Cathodes, 2002 American Institute of Physics, vol. 81, No. 19, Nov. 4, 2002. Abstract Only.

M. Lambea, et al., Analysis of Multilayer Frequency Selective Surfaces with Rectangular Geometrics, Polytechnic Univ. Madrid, Publication Date: Apr. 4-7, 1995, pp. 528-531. Abstract Only.

J.J. Maciel, et al. Gaussian Beam Analysis of Propagation from an Extended Plane Aperture Distribution through Dielectric Layers.II. Cylindrical Layer, Raytheon Co., Tewksbury, MA, Antennas and Propagation, IEEE Transactions on, Publication Date: Oct. 1990, vol. 38, Issue 10 pp. 1618-1624.

Shyam Muraka, Interlayer Dielectrics For SemiConductor Technologies, 1, Publication Date: Oct. 2003. Abstract Only.

H. Ostner, et al. Radiation from One-Dimensional Dielectric Leaky Wave Antennas, Antennas and Propagation, IEEE Transactions on, Publication Date: Apr. 1995, vol. 43, Issue 4. pp. 331-339. Abstract Only.

* cited by examiner

GAP FREE ANCHORED CONDUCTOR AND DIELECTRIC STRUCTURE AND METHOD FOR FABRICATION THEREOF

BACKGROUND

1. Field of the Invention

The invention relates generally to conductor layers with microelectronic structures. More particularly, the invention relates to enhanced performance conductor layers within microelectronic structures.

2. Description of the Related Art

In addition to microelectronic devices, such as but not limited to transistors, resistors, capacitors and diodes, microelectronic structures, including in particular semiconductor structures, typically also include patterned conductor layers that are separated by dielectric layers. These patterned conductor layers are typically used for connecting and interconnecting the microelectronic devices within the microelectronic structures to form fully functional microelectronic circuits.

As microelectronic structure and device dimensions continue to decrease, and microelectronic structure and device performance expectations continue to increase, compromised performance of patterned conductor layer portions of microelectronic circuits are beginning to contribute commensurately greater proportions of overall compromised performance of microelectronic circuits. For example, patterned conductor layer based time delays are becoming an increasingly larger portion of overall semiconductor circuit based time delays when fabricating semiconductor circuits. In addition, as semiconductor structure and device dimensions decrease and patterned conductor layer dimensions also decrease, other detrimental patterned conductor layer effects, such as but not limited to electromigration effects, also become more prominent within microelectronic circuits.

Thus, desirable are semiconductor structures and methods for fabricating the semiconductor structures that include therein fully functional and reliable patterned conductor layers.

SUMMARY OF THE INVENTION

The invention includes a dielectric and conductor structure for use within a microelectronic structure and a method for fabricating the dielectric and conductor structure for use within the microelectronic structure. In particular, the dielectric and conductor structure includes an aperture through a dielectric layer to expose a portion of a first conductor layer located beneath the dielectric layer. The aperture penetrates vertically into the first conductor layer and extends laterally within the first conductor layer without exposing an underside of the dielectric layer. A second conductor layer may be located and formed anchored within this extended and winged aperture while using a plating method. Such a plated second conductor layer is formed while avoiding any voids interposed between either the first conductor layer, or the dielectric layer, with the second conductor layer that is formed while using the plating method. In particular, such voids are avoided within the context of the plating method since the underside of the dielectric layer is covered with the first conductor layer, rather than being exposed.

A microelectronic structure in accordance with the invention includes a first conductor layer located over a substrate. The microelectronic structure also includes a dielectric layer located over the first conductor layer. The dielectric layer includes an aperture located through the dielectric layer that exposes the first conductor layer and provides a sidewall discontinuity within the first conductor layer. The aperture also penetrates vertically into the first conductor layer and extends laterally within the first conductor layer beneath the dielectric layer but does not expose an underside of the dielectric layer. The microelectronic structure also includes a second conductor layer located within the aperture. Within the microelectronic structure, there is no void at an interface of the first conductor layer and the second conductor layer, or an interface of the first conductor layer and the dielectric layer.

A method for fabricating a mnicroelectronic structure in accordance with the invention includes forming an aperture through a dielectric layer located over a first conductor layer in turn located over a substrate while using an isotropic etchant. The aperture penetrates vertically into the first conductor layer and provides a sidewall discontinuity within the first conductor layer. The aperture also extends laterally within the first conductor layer beneath the dielectric layer, to expose an underside of the dielectric layer. The method also includes sputtering the first conductor layer exposed within the aperture to form an extended and winged aperture that lines the underside of the dielectric layer. The method also includes forming a second conductor layer into the extended and winged aperture.

This invention is desirable within the context of integration of metal barrier/liner deposition schemes with (ultra)low-k dielectric materials (k<2.7). Those dielectrics are very susceptible to damage induced by an Ar-based sputter process during liner deposition that forms a recess in an underlying metal layer. Often, after liner deposition, a copper seed deposition that is typically carried out by physical vapor deposition will lead to a constriction of an available cavity (nonconformal deposition profile during PVD) opening that cannot be filled without voids during subsequent methods such as electroplating.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes a dielectric and conductor structure, and a method for fabricating the dielectric and conductor structure, is understood within the context of the description that follows. The description that follows is understood within the context of the drawings described above. Since the drawings are intended for illustrative purposes, the drawings are not necessarily drawn to scale.

FIG. 1 to FIG. 6 show a series of schematic cross-sectional diagrams illustrating the results of progressive stages in fabricating a microelectronic structure in accordance with an embodiment of the invention. This particular embodiment comprises a preferred embodiment of the invention.

Figure 1:
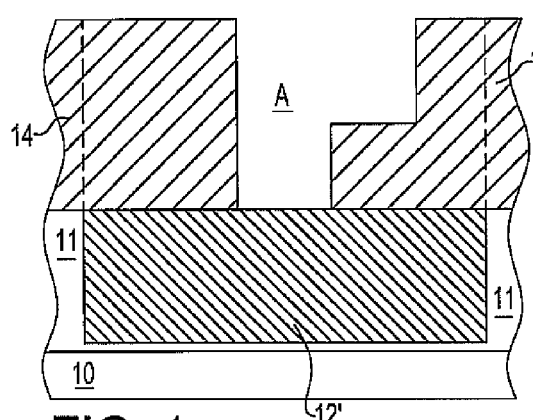
FIG. 1 to FIG. 6 show a series of schematic cross-sectional diagrams illustrating the results of progressive stages in fabricating a microelectronic structure in accordance with an embodiment of the invention.

FIG. 1 shows a substrate 10. A first dielectric layer 11 is located upon the substrate 10 and a first conductor layer 12 is located embedded within the first dielectric layer 11. Finally, a second dielectric layer 14 having an aperture A located therein is located upon portions of the first dielectric layer 11 and the first conductor layer 12.

The substrate 10 may comprise any of several materials, including but not limited to dielectric substrate materials, such as but not limited to ceramic substrate materials, as well as semiconductor substrate materials. More particularly, the substrate 10 when comprising a semiconductor material may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limting examples of compound semiconductor materials include gallium arsenide, indium arsenide and indium phosphide semiconductor materials. Typically, the substrate 10 has a thickness from about 1 to about 3 mils.

While the present particularly illustrated embodiment illustrates the invention most particularly within the context of a substrate that comprises a semiconductor substrate, the embodiment is not intended to be so limited. Rather, the embodiment and the invention also contemplate the use of a semiconductor-on-insulator substrate or a hybrid orientation substrate for the substrate. A semiconductor-on-insulator substrate includes a base semiconductor substrate that is separated from a surface semiconductor layer by a buried dielectric layer. A hybrid orientation substrate includes multiple semiconductor regions of different crystallographic orientation supported upon a single substrate.

Although not specifically illustrated within the schematic cross-sectional diagram of FIG. 1, when the substrate 10 comprises at least in-part a semiconductor substrate or at least in-part a surface semiconductor layer, the substrate 10 will preferably have microelectronic devices located and fabricated therein and/or thereupon. Such microelectronic devices may include, but are not necessarily limited to, resistors, transistors, diodes and capacitors.

The first dielectric layer 12 and the second dielectric layer 14 may comprise any of several dielectric materials. The first dielectric layer 11 and the second dielectric layer 14 may comprise generally higher dielectric constant dielectric materials (i.e., having a dielectric constant from about 4 to about 20) such as but not limited to oxides, nitrides and oxynitrides of silicon. The first dielectric layer 11 and the second dielectric layer 14 may alternatively comprise generally lower dielectric constant dielectric materials (i.e., having a dielectric constant from about 2.0 to about 4). Such lower dielectric constant dielectric materials may include, but are not necessarily limited to, microporous dielectric materials, nanoporous dielectric materials, spin-on-glass dielectric materials and spin-on-polymer dielectric materials. The first dielectric layer 11 and the second dielectric layer 14 may be formed using otherwise generally conventional methods that are appropriate to their materials of composition. Representative non-limiting methods include thermal or plasma oxidation or nitridation methods, spin-coating methods, chemical vapor deposition methods and physical vapor deposition methods. Typically, each of the first dielectric layer 11 and the second dielectric layer 14 has a thickness from about 500 to about 10,000 angstroms.

The first conductor layer 12 comprises a conductor material. Such a conductor material may comprise any of several metals, metal alloys, metal nitrides and metal silicides, as well as laminates thereof and composites thereof. Desirable for the first conductor layer 12 are titanium, tungsten, copper, and silver metals, as well as laminates thereof and alloys thereof. Copper is a particularly common first conductor layer 12 metal, which will typically include a barrier layer to separate the first conductor layer 12 from the first dielectric layer 11. Such barrier layers may include titanium, tungsten, or tantalum materials, as well as nitrides and other alloys of titanium, tungsten, or tantalum materials and tungsten materials, as well noble-barrier materials such as ruthenium, iridium, rhodium, and alloys thereof.

As is understood by a person skilled in the art, the aperture A that is illustrated in FIG. 1 comprises a dual damascene aperture. The dual damascene aperture includes a via aperture at the base of which is exposed the first conductor layer 12. The dual damascene aperture also includes a trench aperture overlapping the via aperture. Although the dual damascene aperture may be formed using particular etch stop layers for proper positioning of the trench aperture with respect to the via aperture, those particular layers, or related structures, are not illustrated in FIG. 1.

While the embodiment whose schematic cross-sectional diagram is illustrated in FIG. 1 shows the substrate 10 and the first dielectric layer 11, for clarity the substrate 10 and the first dielectric layer 11 are omitted in all of the subsequent drawing FIGURES.

Figure 2:
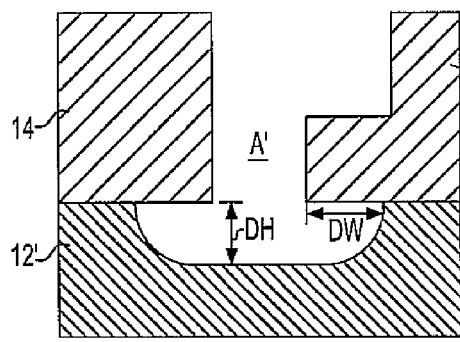

FIG. 2 shows the results of isotropically etching the first conductor layer 12 to form a first conductor layer 12', while using the second dielectric layer 14 as a mask. This isotropic etching forms an aperture A' from the aperture A. The foregoing isotropic etching may use any of several isotropic etchants, including but not limited to wet chemical isotropic etchants and dry plasma isotropic etchants. More generally common are wet chemical isotropic etchants, which will typically include acidic wet chemical isotropic etchants. As is illustrated within the schematic cross-sectional diagram of FIG. 2, the resulting isotropically etched first conductor layer 12' is isotropically etched to undercut beneath the second dielectric layer 14 at the location of the aperture A' by an undercut distance DW from about 5 to about 100 nanometers and an undercut height DH from about 5 to about 100 nanometers.

Figure 3:
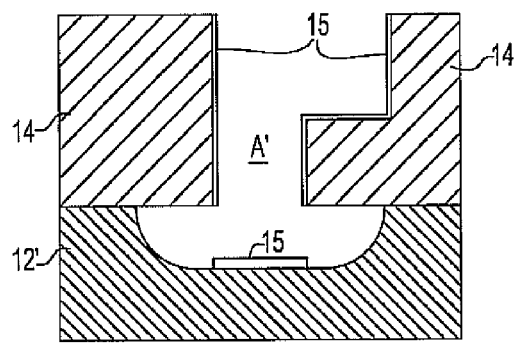

FIG. 3 shows the results of depositing and forming a liner layer 15 lining the aperture A'. The liner layer 15 may comprise a dielectric liner material, or in an alternative, the liner layer 15 may comprise a conductor liner material. Conductor liner materials are more common insofar as conductor liner materials do not compromise the electrical conductivity of the first conductor layer 12'. Typical conductor materials for a conductor liner layer 15 include, but are not limited to, nitrides of titanium, tantalum and tungsten, as well as noble metal liner materials such as but not limited to ruthenium, iridium, and rhodium. The liner layer 15 may be formed using methods including but not limited to thermal nitridation methods, chemical vapor deposition methods, atomic layer deposition methods, and physical vapor deposition methods. Typically, the liner layer 15 has a thickness from about 10 to about 250 angstroms.

Figure 4:
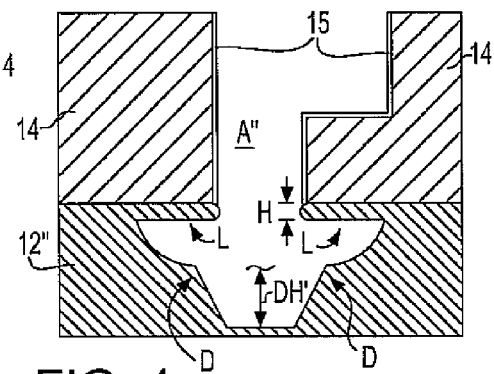

FIG. 4 shows the results of sputtering and redepositing a conductor material from the conductor layer 12' that is illustrated in FIG. 3 to form a conductor layer 12", and to also provide an aperture A" from the aperture A' that is illustrated in FIG. 3. As is illustrated within FIG. 4, the aperture A" is located through the second dielectric layer 14. The aperture A" is also located vertically penetrating into the first conductor layer 12". Finally, the aperture A" is also located laterally extending within the first conductor layer 12" while not exposing the underside of the second dielectric layer 14. Rather, the underside of the second dielectric layer 14 is covered by a lobe L of sputtered conductor material from the conductor layer 12', particularly although not necessarily under circumstances where no hard mask layer is interposed between the second dielectric layer 14 and the conductor layer 12'. The lobe L, when present, may under certain circumstances be discontinuous with respect to the area that the lobe L covers. The lobe L may have a thickness H from about 1 to about 50 angstroms. As is illustrated in FIG. 4, the foregoing sputtering and redeposition provides a discontinuity D within the sidewall of the dual damascene aperture A" that is bounded by the first conductor layer 12". Within the context of the instant embodiment, such a sidewall "discontinuity" is intended as an inflection point that provides for other than a smoothly curved and flowing sidewall (and bottom) of the aperture A' that is illustrated in FIG. 3.

The sputtering method that is used to form the conductor layer 12" that is illustrated in FIG. 4 from the conductor layer 12' that is illustrated in FIG. 3 is desirably tuned to remove the liner layer 15 from the conductor layer 12' at the base of the aperture A' when forming the aperture A" but not completely from portions of the second dielectric layer 14. The sputtering method is typically an argon ion based sputtering method that uses the following operating parameters and limitations: (1) about 0.1 to about 100 m Torr Ar pressure; and (2) a suitable choice of Ar plasma and bias power to give an etched material removal of about 10 Angstrom to about 300 Angstrom (based on an etch rate calibration using blanket reference wafers of a material such as SiO2 or Ta, etc.). As a result of the foregoing sputtering, the conductor layer 12" is etched to an additional depth DH' from about 1 to about 50 nanometers.

Figure 5:
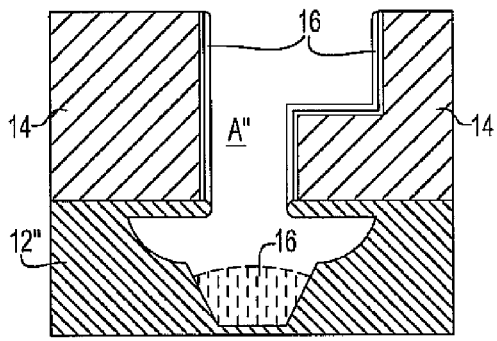

FIG. 5 shows a conductor seed layer 16, which is typically a copper seed layer, located within the aperture A" and connecting to the lobe L portions of the first conductor layer 12". An additional and optional portion of the conductor seed layer 16 may be formed filling the base of the aperture A" and contacting the conductor layer 12", particularly when the conductor seed layer 16 is formed using a sputtering method. The conductor seed layer 16 typically comprises a copper material. The copper material may be deposited using methods that are otherwise generally conventional in the semiconductor fabrication art. Such methods may include, but are not necessarily limited to, electroless deposition methods, ion plating methods, vapor deposition methods, and sputtering methods. Under circumstances where the additional and optional portion of the conductor seed layer 16 is formed at the base of the aperture A", the presence of the featured recess of depth DH' as illustrated in FIG. 4 allows for a larger, less-constricted space for subsequent void-free fill of the aperture A" with a conductor material, as described below.

Although not specifically illustrated in FIG. 5, an additional liner layer may be formed upon the semiconductor structure of FIG. 4 prior to forming the conductor seed layer 16. A purpose of this conductive liner would be to cover any potential "exposed" dielectric areas that would otherwise come in direct contact with a maim conductor, such as a Cu-based main conductor. Examples of such exposed dielectric areas may include misaligned via structures (part landing on conductor 12, part landing on dielectric 11, as illustrated in FIG. 1).

Figure 6:
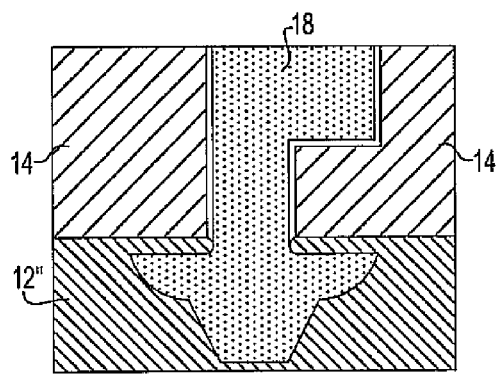

FIG. 6 shows an anchored contiguous via and interconnect layer 18 located within the extended and winged aperture A" that is illustrated in FIG. 5. The anchored contiguous via and interconnect layer 18 may be formed using any of several methods and materials, but the anchored contiguous via and interconnect 18 typically comprises copper, or some alternative conductor that may be formed, typically using a plating method. As is illustrated within the schematic cross-sectional diagram of FIG. 6, the anchored contiguous via and interconnect 18 is formed while using a plating method in a fashion that does not provide for formation of voids at the juncture of the anchored contiguous via and interconnect 18 with either of the first conductor layer 12" or the dielectric layer 14.

FIG. 6 shows a schematic cross-sectional diagram illustrating a dielectric and metal structure for use within a microelectronic structure, and in particular a semiconductor structure The dielectric and metal structure includes a first conductor layer 12" located over a substrate (i.e., substrate 10 as illustrated in FIG. 1). The dielectric and metal structure also includes a dielectric layer 14 located upon the first conductor layer 12". As is illustrated in FIG. 5, an extended and winged aperture A" is located through the dielectric layer 14. The extended and winged aperture also penetrates vertically into the first conductor layer 12" while also extending laterally within the first conductor layer 12" beneath the second dielectric layer 14 but not exposing an underside of the second dielectric layer 14. As is further illustrated within the schematic cross-sectional diagram of FIG. 6, an anchored contiguous via and interconnect 18 is located and formed into the extended and winged dual damascene aperture A".

The preferred embodiment is illustrative of the invention rather than limiting of the invention. Revisions and modifications may be made to methods, materials, structures and dimensions of a microelectronic structure in accordance with the preferred embodiment, while still providing a microelectronic structure in accordance with the invention, further in accordance with the accompanying claims.

What is claimed is:

1. A method for fabricating a microelectronic structure comprising:

forming an aperture through a dielectric layer located over a first conductor layer in turn located over a substrate while using an isotropic etchant, the aperture penetrating vertically into the first conductor layer and providing a sidewall discontinuity within the first conductor layer, and also extending laterally within the first conductor layer beneath the dielectric layer and exposing an underside of the dielectric layer;

sputtering the first conductor layer exposed within the aperture to form an extended and winged aperture that lines the underside of the dielectric layer; and forming a second conductor layer into the extended and winged aperture.

* * * * *